United States Patent [19]

Hogge, Jr.

[11] Patent Number: 4,535,459

[45] Date of Patent: Aug. 13, 1985

[54] SIGNAL DETECTION APPARATUS

[75] Inventor: Charles R. Hogge, Jr., Richardson, Tex.

[73] Assignee: Rockwell International Corporation, El Segundo, Calif.

[21] Appl. No.: 498,385

[22] Filed: May 26, 1983

[51] Int. Cl.³ .................. H03K 1/17; H03K 5/156
[52] U.S. Cl. ................................ 375/80; 375/120; 328/133
[58] Field of Search ............... 375/80, 81, 82, 119, 375/120; 331/1 A, 17, 34, DIG. 2; 328/133; 329/104; 360/41; 307/516

[56] References Cited

U.S. PATENT DOCUMENTS

| | | | |
|---|---|---|---|
| 4,222,009 | 9/1980 | Moulton et al. | 375/120 |
| 4,227,251 | 10/1980 | Kazama et al. | 375/104 |
| 4,305,045 | 12/1981 | Metz et al. | 331/1 A |
| 4,371,974 | 2/1983 | Dugan | 375/82 |
| 4,380,815 | 4/1983 | Clendening | 375/81 |
| 4,400,667 | 8/1983 | Belkin | 375/120 |
| 4,400,817 | 8/1983 | Summer | 331/1 A |

Primary Examiner—Robert L. Griffin
Assistant Examiner—Stephen Chin
Attorney, Agent, or Firm—Bruce C. Lutz; V. L. Sewell; H. Fredrick Hamann

[57] ABSTRACT

A phase detection function is obtained by performing two series retiming operations on a data input signal in accordance with a local clock and exclusive OR'ing the signals involved in the two retiming operations. The first exclusive OR'ing provides a variable pulse width signal and the second exclusive OR'ing provides a fixed pulse width signal which may be used as a reference. The combination of the two signals can then be used to provide an indication of phase of the clock with respect to the data. By taking the phase detected signal and supplying it in integrated format to a VCO and using the output of the VCO to provide the clock input to the retiming means, a circuit is provided which provides not only data regeneration, but also clock recovery from the data input and assures that the leading edge of the recovered clock is centered between positive going and negative going transitions of the data to be regenerated. This regeneration can take place in the form of jitter reduction, pulse amplitude restore and pulse width restore. The same circuitry can also, through the addition of one feedback loop, provide data equalization.

10 Claims, 7 Drawing Figures

4,535,459

SIGNAL DETECTION APPARATUS

THE INVENTION

The present invention is generally related to electronics and more specifically to digital circuitry. Even more specifically, the invention is related to a circuit for providing a basic but novel phase detector operation which in turn operates in multiple capacities of synchronous data detection, phase detection for clock recovery, and baseband signal equalization.

The various functions performed by the present invention have been accomplished in the prior art, however, typically each of the various functions is performed by separately situated circuitry. In other words, the clock recovery phase detection is performed by a first set of circuitry and the synchronous data detection (or data regeneration in the form of jitter reduction, pulse width restore and pulse amplitude restore) is performed by a second set of circuitry.

The present invention recognizes the possibility that all of these functions as well as the function of baseband signal equalization can be performed by substantially the same circuitry with a pair of D flip-flops being involved in all of the functions.

It is therefore an object of the present invention to provide a basic phase detector which simultaneously performs other functions for the purpose of reducing the total number of components involved in providing data regeneration.

Other objects and advantages of the present invention may be ascertained from a reading of the specification and appended claims in conjunction with the drawings wherein:

DETAILED DESCRIPTION

Figure 1:
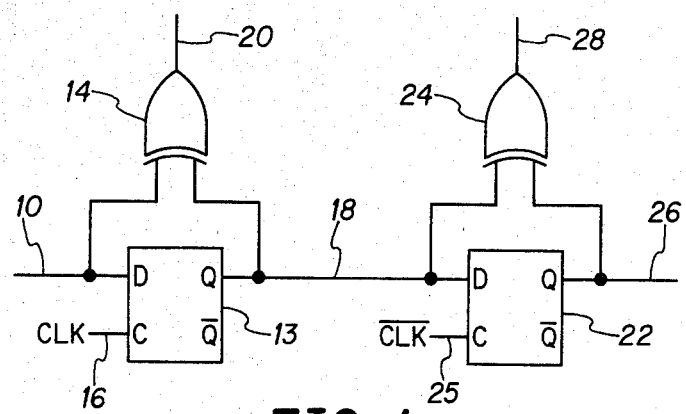
FIG. 1 is a schematic diagram of a basic portion of the present inventive circuit.

In FIG. 1 an incoming data line 10 supplies signals to a D input of a D flip-flop or retiming means 13 as well as to an input of an exclusive OR gate 14. The D flip-flop 13 also has a C or clock input supplied with signals from a lead 16 and a Q output terminal which is connected to a line 18. Line 18 is also connected to a second input of exclusive OR gate 14. Exclusive OR gate 14 has an output 20. Lead 18 is also connected to a D input of a second D flip-flop or retiming means 22 and to an input of a second exclusive OR gate 24. The D flip-flop 22 is substantially identical to D flip-flop 13 and also has a C input for supplying clock signals on a lead 25. As marked, the signal on lead 25 is the inverse of that on lead 16. The Q output of D flip-flop 22 is connected to provide retimed or regenerated data on lead 26 which lead is also connected as a second input to exclusive OR gate 24. An output of exclusive OR gate 24 is labeled 28.

Figure 2A:
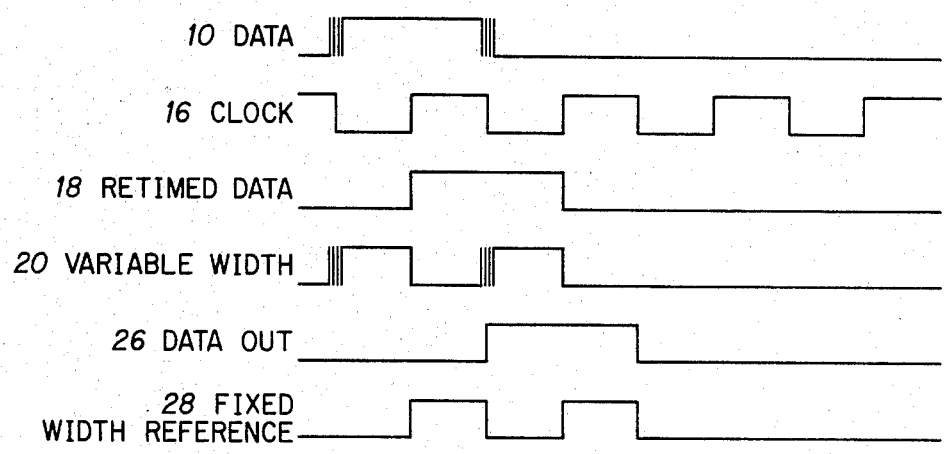
FIG. 2a and 2b are timing diagrams used in explaining the operation of FIG. 1.

The waveforms of FIG. 2a are labeled to correspond with the signals at the various leads of FIG. 1. The incoming data is shown with a set of possibilities for leading and trailing edges due to timing jitter on this data introduced by various sources. The clock on lead 16 is shown as having the positive going transition exactly in the center of the data baud interval (or bit interval) and therefore in a condition where the circuit is balanced. The data is retimed on two separate occasions as appears on leads 18 and 26 so that the data out on lead 26 occurs at a full data period later than the arrival time on lead 10. The output signal on lead 20 also has jitter introduced as a function of the incoming data.

Figure 2B:
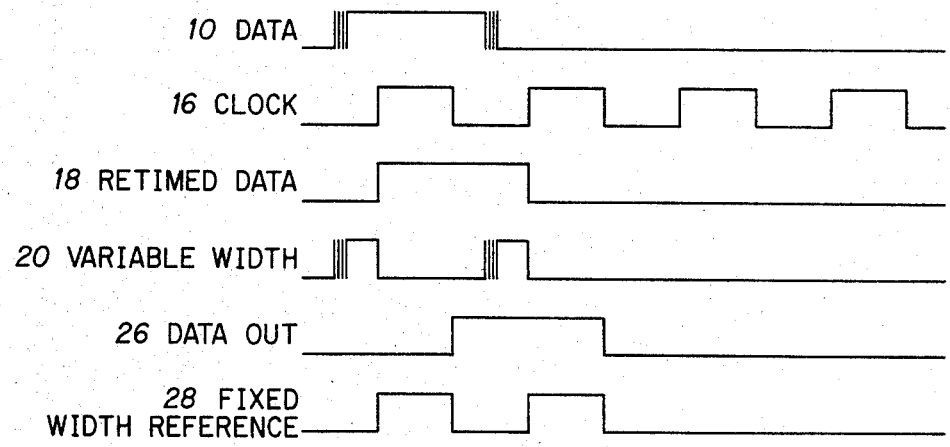

The waveforms of FIG. 2b show the clock arriving early wherein the pulses on lead 20 become smaller with respect to the fixed reference pulses on lead 28. These two signals may be used to generate an error signal in associated circuitry to change the timing of the clock 16 when the device is used as a feedback stabilized clock recovery circuit.

It should be noted that the waveforms of FIGS. 2a and 2b and the circuit of FIG. 1 are based on the assumption that the frequency of operation is such that there is no significant delay in the signal as it passes through the circuitry illustrated. If very high speed operation is desired, the delay in the circuitry can be significant and this problem is addressed in the circuit of FIG. 4 and the associated waveform in FIGS. 5a and 5b.

Figure 3:
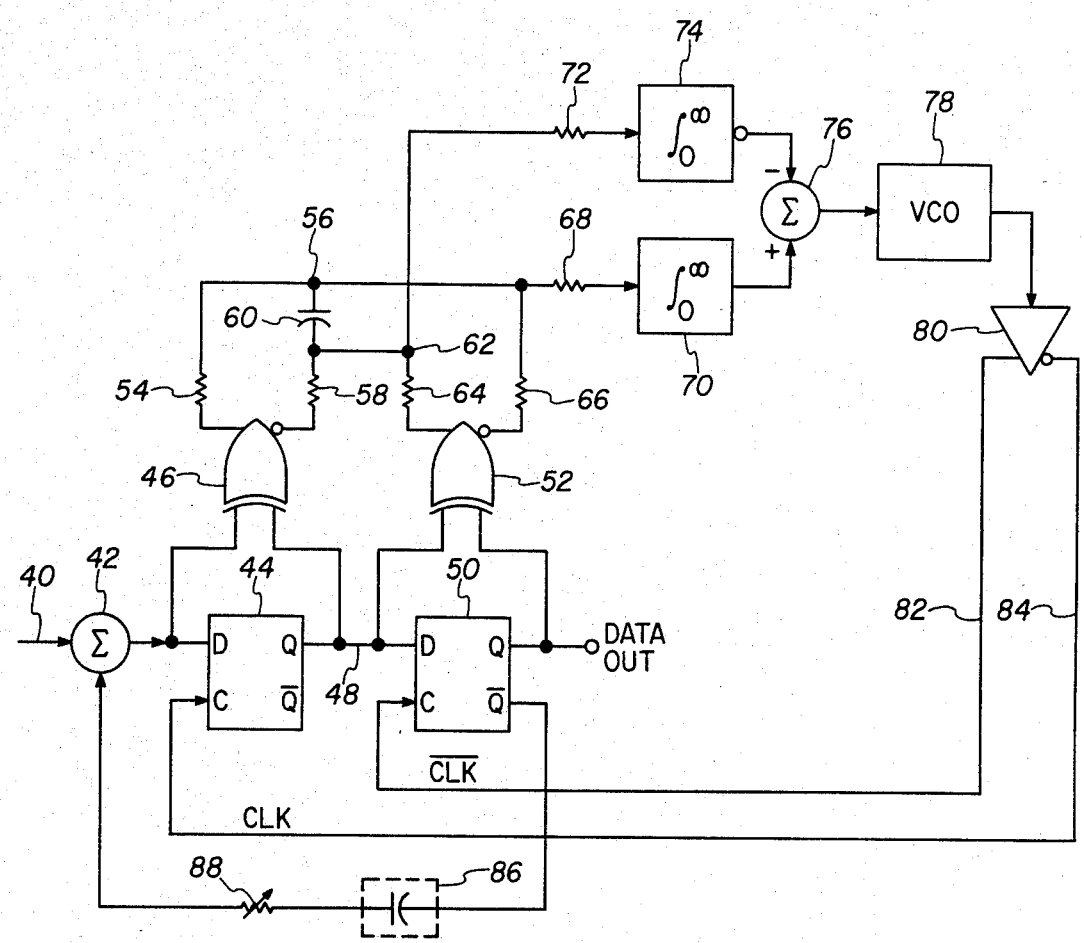
FIG. 3 is a schematic block diagram of the total data regeneration circuit incorporating the circuit of FIG. 1.

In FIG. 3 data is input on a lead 40 to a summing circuit 42 which provides output signals to the D input of a D flip-flop 44 as well as to an input of an exclusive OR gate 46. The flip-flop 44 has a Q output supplying signals on a lead 48 to a second input of exclusive OR gate 46 as well as to a D input of a D flip-flop 50 and to an input of an exclusive OR gate 52. The exclusive OR gate 46 provides signals on a noninverting output through a resistor 54 to a junction point 56. This same exclusive OR gate provides signals on an inverting output through a series connection of a resistor 58 and a capacitor 60 to the junction point 56. A junction between resistor 58 and capacitor 60 is labeled as 62. A resistor 64 is connected between junction point 62 and a noninverting output of exclusive OR gate 52. A resistor 66 is connected between the inverting output of exclusive OR gate 52 and junction point 56. A summing resistor 68 is connected between junction point 56 and an integrating circuit designated as block 70. The junction point 62 is connected through a resistor 72 to a second integrating circuit 74. The outputs of the two integrating circuits 70 and 74 are supplied to a summing circuit 76 which has an output connected to supply signals to a voltage controlled oscillator or controlled variable frequency oscillator 78. This oscillator 78 supplies signals to an amplifier or inverting circuit 80 which provides opposite phase output signals on leads 82 and 84. The signals on lead 84 are designated as clock signals (CLK) and are supplied to the C input of D flip-flop 44 while the signals on lead 82 are designated as not clock or $\overline{CLK}$ signals and are supplied to the clock input of D flip-flop 50. The $\overline{Q}$ output of D flip-flop 50 is connected through a d.c. blocking capacitor 86 and a variable impedance 88 to a second input of summing circuit 42. The capacitor 86 is shown in a dash line box to show that it is optional. In some cases, impedance 88 would be adaptively or dynamically variable.

Figure 4:
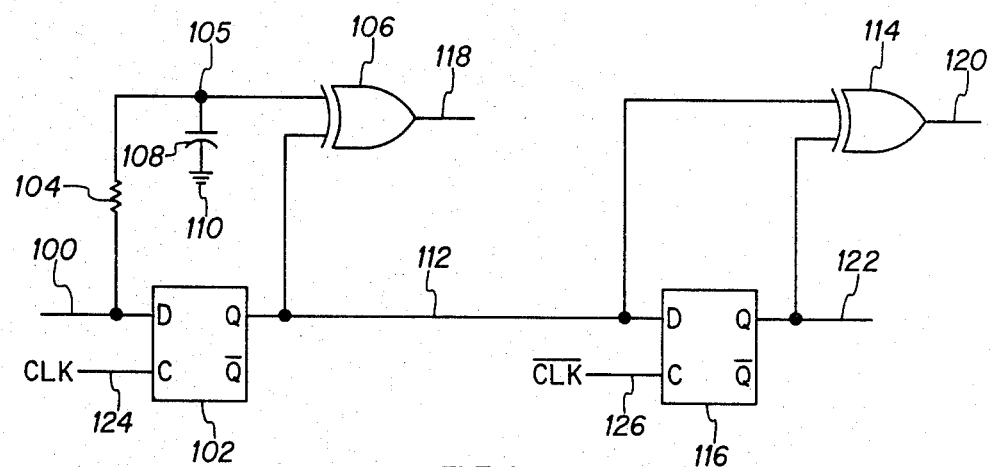
FIG. 4 is a schematic diagram of the circuit of FIG. 1 modified for very high speed operation where there are significant time delays in the circuit.

In FIG. 4 an input lead 100 supplies data signals to a D type flip-flop 102 and also supplies these data signals through a resistor 104 to a junction point 105 and to an input of an exclusive OR gate 106. A capacitor 108 is connected between junction point 105 and ground 110.

A Q output of flip-flop 102 is connected to a lead 112 which supplies retimed data signals to a second input of exclusive OR gate 106, a first input of an exclusive OR gate 114 and to a D input of a D type flip-flop 116. The exclusive OR gate 106 has a variable pulse width output on lead 118 and the exclusive OR gate 114 has a fixed pulse width output on lead 120. The Q output of flip-flop 116 is provided on a retimed data output lead 122. This lead 122 is also connected to a second input of exclusive OR gate 114. A clock input lead 124 is connected to the C or clock input of D flip-flop 102 while a further clock lead 126 is used to supply clock input signals to a C input of D flip-flop 116. The clock signal on lead 116 is of the opposite phase of the clock signal on lead 124 and thus is labeled $\overline{CLK}$. While the apparatus for delaying the signal between lead 100 and junction point 105 is shown as a simple RC network, the delay may be accomplished by various means. In one embodiment of the invention, the signal delay is a combination of a gate delay in an associated line receiver and a RC time constant circuit. In some instances, it may be desirable to make the capacitance of element 108 adjustable to cause shifting of the resulting clock to the timing location relative to the "eye" opening to coincide with that instant in time when the baseband signal has maximum S/N (signal-to-noise ratio) resulting in minimum bit error rate of the logic decision of the synchronous data detector. Although the normal location of the clock would be at the center of the "eye" opening or center of the bit interval, sometimes, the best performance coincides with a slight off-set from center. This can happen when the "eye" is not perfectly symmetrical and is opened wider off center. A variable capacitance 108 is also useful for adjusting out the effects of minor circuit tolerances.

Figure 5A:
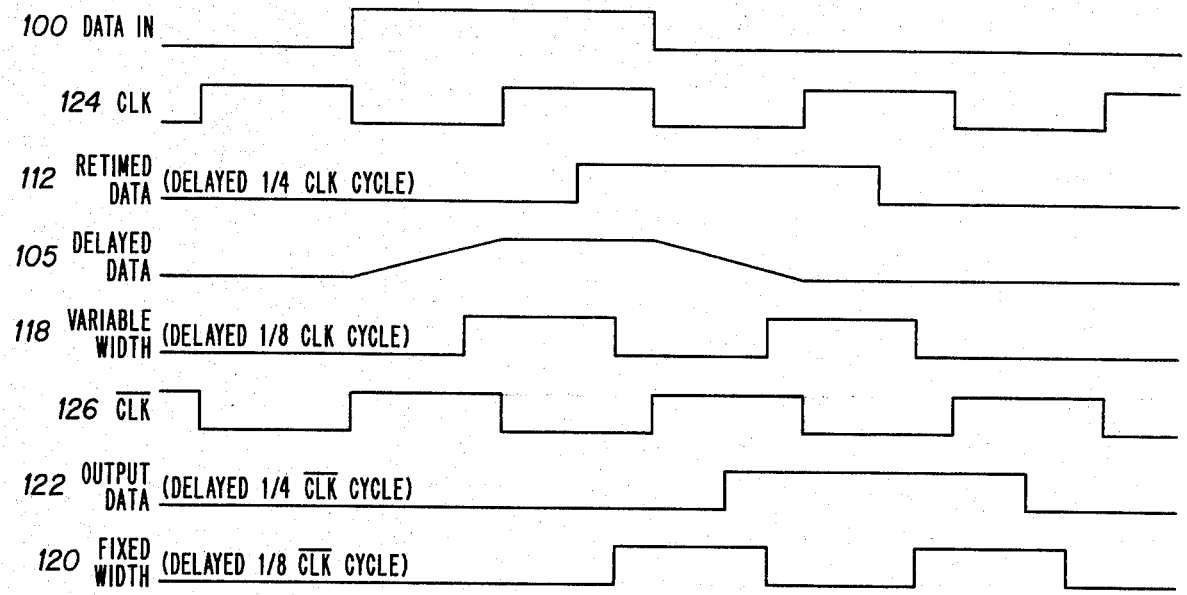
FIGS. 5a and 5b are timing diagrams used in explaining the operation of FIG. 4.
Figure 5B:
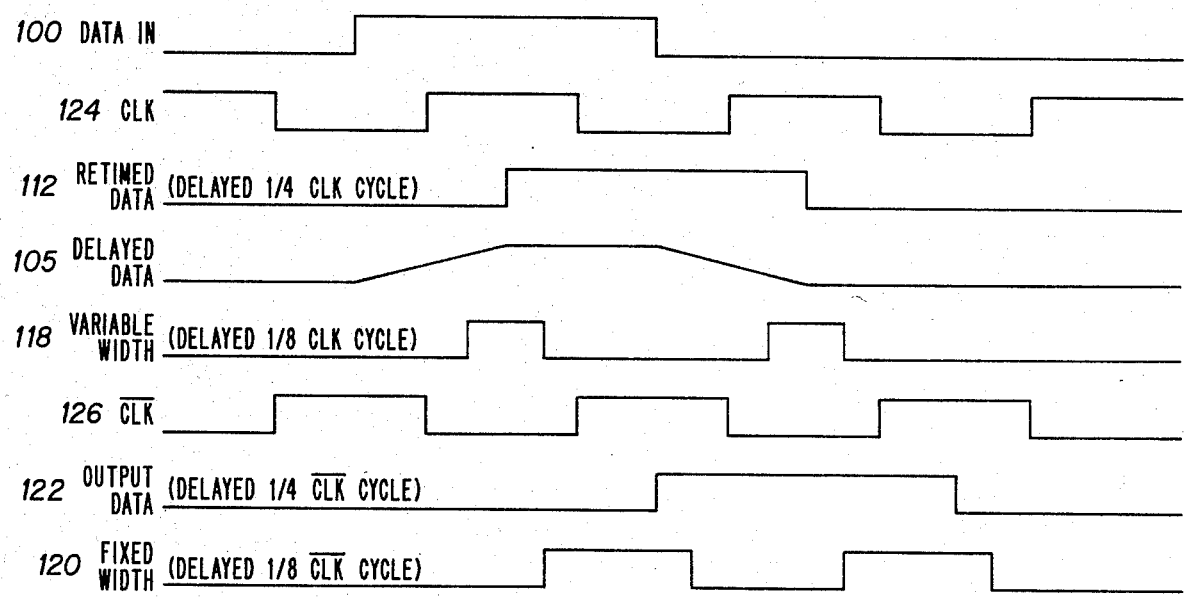

FIGS. 5a and 5b illustrate the waveforms found in FIG. 4. The reason for the circuitry of FIG. 4 is to compensate for delays inherent in electronic flip-flops, exclusive OR's and other circuitry or signal delays caused by other means. These delays become increasingly important with higher speed operation. The waveforms of FIGS. 5a and 5b assume that there is a delay of approximately one-half clock cycle in the D flip-flops 102 and 116 and that there is a delay of approximately one-quarter clock cycle in the exclusive OR gates 106 and 114. Each of the waveforms are designated with a number designating the lead upon which the signal represented by the waveform appears. The waveform labeled 105 illustrates the data pulse as integrated by the combination of integrating capacitor 108 and the input resistor 104. Switching occurs within the exclusive OR gate 106 when the voltage level is approximately half way between the minimum and maximum values shown in waveform 105.

OPERATION

Although the components of the circuit in FIG. 1 provide various functions, the circuit illustrated is primarily a phase detector. This circuit produces a string of fixed width pulses (one pulse for each data transition) at output 28 in response to data signals being received at input 10 and also provides a string of variable width pulses at output 20 in response to these same data signals.

When the clock signal is properly centered as shown in FIG. 2a, the long term average voltage derived from integrating the variable width signal on lead 20 equals the long term average voltage derived from integrating the fixed width signal on lead 28. Any shift in clock position away from center, as shown in FIG. 2b, causes an error voltage to develop when the two integrated waveforms are compared, thus causing a closed loop to restore the clock to center.

The closed loop is illustrated in FIG. 3 where the integrators 70 and 74 provide the long term averaging of the signals output by exclusive OR gates 46 and 52 and compare these voltages in summing circuit 76. Any lack of comparison or difference voltage is thus applied to VCO 78 which will change in frequency such that the clock signals derived from VCO 78 as output on 82 and 84 are returned to the D flip-flops of the phase detector circuit.

Returning to FIG. 1 and its associated waveforms of FIGS. 2a and 2b, it will be noted that the incoming data does not have its leading and trailing data pulse edges at a fixed time with respect to a reference. This is illustrated by the multiple vertical lines in data waveform 10. The utilization of a stable clock eliminates the jitter in a retimed data circuit as shown on either lead 18 or 26. The incoming data is also regenerated as to amplitude and to pulse width by the D flip-flops 13 and 22.

Since the incoming data in one embodiment and as shown in the waveforms is nonreturn to zero (NRZ) data, the clock signal cannot be recovered directly from the incoming signal. The reason clock can't be derived directly from NRZ data is that the NRZ spectrum has a null at clock frequency and there is no energy at clock frequency. The present invention uses an oscillator which is reasonably stable and is fed a signal by the integrators to maintain a given frequency during the periods of time when there are no data transitions. Thus, the circuitry of FIG. 1 as incorporated in FIG. 3 not only provides phase detection for a clock recovery circuit, but in addition provides the data regeneration function in the form of eliminating jitter, redefining pulse width and redefining pulse amplitude.

It should be noted that the regeneration process of the data is complete at the output of the first flip-flop. Thus, although the data is shown being output at the Q output of the second flip-flop in FIG. 3, the regenerated data could be retrieved from the Q or $\overline{Q}$ outputs of either of these flip-flops. In one embodiment of the invention, the data was retrieved from the $\overline{Q}$ output of the second flip-flop.

It should also be noted that while the invention is shown used with NRZ data, it is not so restricted and can be used with other data formats. One embodiment of the invention has been used with filtered return-to-zero or RZ data. Further, there is no technical reason why the circuit cannot recover the clock signal from a multilevel baseband such as in a digital radio.

The circuit of FIG. 3 also has a feedback from the $\overline{Q}$ output of flip-flop 50 to the summing circuit 42. This feedback accomplishes the feedback of a single tap equalizer. Additional stages of pairs of flip-flops such as 44 and 50 can be utilized, each providing an output through a capacitor, resistor combination similar to 86 and 88 and all of which would sum their signals to the summing circuit 42. Thus, the same concept can be used for a multitap equalizer. In any event, the flip-flops are part of at least three different circuit functions.

All of the above explanation has been based on the assumption that there is no significant delay in the signal passing through the flip-flops and the exclusive OR gates as compared to the pulse width of the operational frequency. The waveforms of FIG. 5 assume that there is a delay of approximately one-half clock cycle in the signal passing through the D flip-flops and approximately one-fourth of a clock cycle in passing through the exclusive OR gates. The simple expedient of introducing a known delay between the baseband signal input 100 and the input at 105 of exclusive OR gate 106 as shown in FIG. 4 makes the circuit of FIG. 3 usable at data rates substantially greater than would otherwise be possible for any given set of devices.

As may be observed from an examination of the waveforms of FIGS. 5a and 5b in conjunction with FIG. 4, the delay of data as shown in waveform 105 provides complete compensation to the retiming circuits so that the output data is merely delayed slightly with respect to what it would be with the circuitry of FIG. 1.

The time of occurrence of the phase detection signals from exclusive OR gates 106 and 114 is not critical (only the pulse width). As may be observed, the pulse width of the signal 105 is unaffected by the delay introduced by resistor 104 and capacitor 108. It is assumed for the purposes of the waveforms that the exclusive OR gate 106 is actuated when the input signal changes more than halfway between minimum and maximum values and further that there is a quarter clock delay before the output signal on lead 118 is obtained. The same delay will be found in the waveform 120 which changes one-quarter clock cycle after a change of the inputs on leads 112 and 122.

Although I have illustrated at least one embodiment of the invention as shown by the various drawings, I wish to be limited not by the invention illustrated but only by the scope of the appended claims which describe a phase detector circuit and that circuit as utilized in various configurations.

I claim:

1. Phase detector means comprising, in combination:
    data signal input means for supplying input data;
    first D flip-flop means, including D and C (clock) input terminal means and Q output terminal means;
    second D flip-flop means, including D and C (clock) input terminal means and Q output terminal means;
    first EOR (exclusive OR) means, including input means and output means, connected to receive input signals at said input means thereof from the D and Q terminal means of said first flip-flop means
    second EOR (exclusive OR) means, including input means and output means, connected to receive input signals at said input means thereof from the D and Q terminal means of said second flip-flop means
    means connecting said data signal input means to said D input terminal means of said first flip-flop means;
    means connecting said Q output terminal means of said first flip-flop means to said D input terminal means of said second flip-flop means;
    first and second integrating means, each including input means and output means, connected to said output means of said first and second EOR means for receiving input signals therefrom;
    VCO (controlled variable frequency oscillator) means, including input means and first and second opposite phase signal output means, connected to said output means of said first and second integrator means for receiving output signals therefrom, said VCO means varying in frequency as a function of the sum of the signals received from said first and second integrator means;
    means connecting said first and second output means of said VCO to said C input means of said first and second D flip-flop means respectively; and
    means for outputting retimed data from the Q output terminal means of said second flip-flop means.

2. The method of synchronously regenerating a data signal comprising the steps of:
    passing the data signal through a series connection D type flip-flops each including D, C and Q terminals;
    exclusive ORing the signals appearing at the D and Q terminals of each of the two D flip-flops;
    differentially integrating and summing the results of the exclusive ORing to provide a control voltage;
    generating a variable frequency output signal in response to the value of said control voltage; and
    clocking the C terminals of said D flip-flops as a function of said variable frequency output signal.

3. The method of simultaneously recovering a clock signal and regenerating a data signal comprising the steps of:
    passing the data signal through a series connection of two D type flip-flops each including D, C and Q terminals;
    exclusive ORing the D and Q terminal signal outputs of each of the two D flip-flops;
    differentially integrating and summing the results of the exclusive ORing to provide a control voltage;
    generating a variable frequency output signal in response to the value of said control voltage; and
    clocking the C terminals of said D flip-flops as a function of said variable frequency output signal.

4. Apparatus for regenerating a data signal comprising, in combination:
    means for supplying data to be regenerated;
    means for passing said data through a series connection of two D type flip-flops each including D, C and Q terminal means;
    means for exclusive ORing the signals appearing at the D and Q terminal means of each of the two D type flip-flops;
    means for differentially integrating and summing the results of the exclusive ORing to provide a control voltage;
    means for generating a variable frequency output signal in response to the value of said control voltage; and
    means for supplying clock signals to the C terminals of said D flip-flops as a function of said variable frequency output signal.

5. Apparatus for simultaneously recovering a clock signal and regenerating a data signal comprising the steps of:
    means for passing the data signal through a series connection of two D type flip-flops each including D, C and Q terminals;
    means for exclusive ORing the signals appearing at the D and Q terminals of each of the two D flip-flops;
    means for differentially integrating and summing the results of the exclusive ORing to provide a control voltage;
    means for generating a variable frequency output signal in response to the value of said control voltage; and
    means for clocking the C terminals of said D flip-flops as a function of said variable frequency output signal.

6. Phase detector means comprising, in combination:
first means for retiming an incoming data signal in accordance with a local clock signal to produce a first retimed data signal;
second means for retiming said first retimed data signal in accordance with said local clock signal to produce a second retimed data signal;
third means for exclusive ORing said incoming data signal with said first retimed data signal to produce a variable width control signal indicative of phase; and
fourth means for exclusive ORing said first retimed data signal with said second retimed data signal to produce a fixed width reference signal.

7. Combined data detection, data signal regeneration and clock recovery apparatus using the apparatus of claim 6 and comprising, in addition:
controlled variable frequency oscillator means connected to said third and fourth means for receiving said variable width control signal and said fixed width reference signal therefrom, the frequency of said variable frequency oscillator changing as a function of the integrated and summed values of the received signals; and
means for generating two opposite phase clock signals from the signal output by said oscillator means and applying same to clock said first and second means respectively.

8. Clock recovery apparatus using the apparatus of claim 6 and comprising, in addition:
controlled variable frequency oscillator means connected to said third and fourth means for receiving said variable width control signal and said fixed width reference signal therefrom, the frequency of said variable frequency oscillator changing as a function of the integrated and summed values of the received signals; and
means for generating two opposite phase clock signals from the signal output by said oscillator means and applying same to clock said first and second means respectively.

9. Data detection apparatus using the circuitry of claim 6 and comprising, in addition:
controlled frequency oscillator means connected to said third and fourth means for receiving said variable width control signal and said fixed width reference signal therefrom, the frequency of said controlled frequency oscillator changing as a function of the integrated and summed values of the received signals; and
means for generating two opposite phase clock signals from the signal output by said oscillator means and applying same to clock said first and second means respectively.

10. Combined data detection, data signal regeneration and clock recovery apparatus using the apparatus of claim 6 and comprising, in addition:
controlled variable frequency oscillator means connected to said third and fourth means for receiving said variable width control signal and said fixed width reference signal therefrom, the frequency of said variable frequency oscillator changing as a function of the integrated and summed values of the received signals;
means for generating two opposite phase clock signals from the signal output by said oscillator means and applying same to clock said first and second means respectively; and
means for delaying and inverting said second retimed data signal and summing the result with said incoming data signal in a feedback manner to equalize data being passed.

* * * * *